(12) United States Patent
Yano

(10) Patent No.: US 6,410,408 B1
(45) Date of Patent: Jun. 25, 2002

(54) CVD FILM FORMATION METHOD

(75) Inventor: Hisashi Yano, Takaoka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/941,868

(22) Filed: Aug. 30, 2001

(30) Foreign Application Priority Data

Aug. 31, 2000 (JP) ........................................ 2000-261987
Aug. 20, 2001 (JP) ........................................ 2001-248447

(51) Int. Cl.[7] ........................ H01L 21/20; H01L 21/302
(52) U.S. Cl. ...................... 438/484; 438/485; 438/487; 438/715
(58) Field of Search ................................ 438/484, 715, 438/485, 684, 784, 925, 487; 118/226, 723

(56) References Cited

U.S. PATENT DOCUMENTS

| | | | | |
|---|---|---|---|---|
| 4,816,113 A | * | 3/1989 | Yamazaki ................... | 118/50.1 |
| 4,971,667 A | * | 11/1990 | Yamazaki et al. ....... | 118/723 E |
| 5,368,685 A | * | 11/1994 | Kumihashi et al. ........ | 156/345 |
| 5,512,102 A | * | 4/1996 | Yamazaki ............. | 118/723 MA |
| 5,523,126 A | * | 6/1996 | Sano et al. .................. | 118/718 |
| 5,562,952 A | * | 10/1996 | Nakahigashi et al. ......... | 118/50 |
| 5,589,007 A | * | 12/1996 | Fujioka et al. .............. | 118/718 |
| 5,611,863 A | * | 3/1997 | Miyagi ................... | 118/723 E |
| 5,900,103 A | * | 5/1999 | Tomoyasu et al. ....... | 118/723 E |

\* cited by examiner

*Primary Examiner*—Michael S. Lebentritt
(74) *Attorney, Agent, or Firm*—Parkhurst & Wendel, L.L.P.

(57) ABSTRACT

It is an object of the present invention, when forming a high-density plasma CVD film, to suppress the production of particles, which are the cause of unsatisfactory formation of a micropattern, without causing a drop in productivity, and thus improve the yield of a semiconductor device. For this purpose, a CVD film is formed on a predetermined plurality of semiconductor substrates by repeating, in order, a process #101a in which a plasma CVD film is formed on a semiconductor substrate, and a process #101b in which low-pressure cleaning of the inside of a reaction chamber is performed by way of exhaustion to a first exhaust line on which a turbo pump employed in #101a is placed. In this manner, reactant, which has adhered to the first exhaust line, can be removed during the low-pressure cleaning. Cleaning of a second exhaust line or rough exhaust line, which does not have a turbo pump placed thereon, is performed as a result of the cleaning of the inside of the reaction chamber using this rough exhaust line, at least before or after the formation of a CVD film on a plurality of semiconductor substrates, for example, in processes #100 and #151.

9 Claims, 5 Drawing Sheets

CVD FILM FORMATION METHOD

BACKGROUND OF THE INVENTION

1. Field of the Invention

The present invention relates to a CVD film formation method using high-density plasma.

2. Description of the Related Art

In addition to achieving a detailed pattern (hereinafter referred to as "micropattern") for semiconductor integrated circuit elements, it has become essential to ensure that high-aspect ratio interwiring spaces are filled using interlayer insulating film without the generation of voids, or that interwiring capacitance is reduced using a low-dielectric constant film so that wiring delay is reduced. For this reason, a high-density plasma CVD (chemical vapor deposition) technique has become essential, by which method not only is it possible to perform film formation and Ar sputtering etching simultaneously, and to improve filling characteristics of the insulating film or the like, but an insulating film of high quality can also be formed which is doped with fluorine in order to obtain low dielectric constant.

FIG. 4 is a schematic cross-sectional view of a high-density plasma CVD device. This CVD device is a leaf-type CVD device in which semiconductor substrates are processed one at a time. An electrostatic chuck 3 is provided, whereon a semiconductor substrate 2 to be processed is placed, inside a reaction chamber 1.

Components connected to this reaction chamber 1 are: a reactive gas supply line 4; a cleaning gas supply line 5; a main exhaust line 8, which has a exhaust valve 6 placed thereon and which is connected to a dry pump 7 at one end; and a rough exhaust line 11, which has a exhaust valve 9 and a throttle valve 10 placed thereon and which is connected to the dry pump 7 at one end on the side the throttle valve 10 is placed.

An applicator 12, which changes cleaning gas to plasma, is placed on the cleaning gas supply line 5. A throttle valve 13, a gate valve 14 and a turbo pump 15 are placed on the main exhaust line 8, between the reaction chamber 1 and the exhaust valve 6, in this order from the reaction chamber 1 side. The turbo pump 15 is used since reactive gas can thus be exhausted in the course of the formation of a CVD film and, further, a considerable vacuum can thereby be achieved in the reaction chamber 1, and also since a turbo pump currently constitutes the only means of fulfilling such conditions.

A process of forming a CVD film, which utilizes the above-mentioned high-density plasma CVD device, will be described hereinbelow with reference to the flow chart of FIG. 5.

First of all, at #400, with the gate valve 14 of the main exhaust line 8 closed, while 1100 sccm of nitrogen trifluoride ($NF_3$) is being introduced from the cleaning gas supply line 5, the pressure in the reaction chamber 1 is controlled to be a high pressure of 3 Torr by way of exhaustion via the rough exhaust line 11, which is at a low vacuum and is connected to the dry pump 7, so that cleaning is performed inside the reaction chamber 1. The path, along which $NF_3$ flows, runs in the following order; from the applicator 12 to the reaction chamber 1, the exhaust valve 9, the throttle valve 10 and the dry pump 7.

Next, at #401a, reactive gas, which is a mixture of monosilane ($SiH_4$), oxygen ($O_2$) and argon (Ar), is introduced from the reactive gas supply line 4, and the pressure of the reaction chamber 1 is controlled to be 6 m Torr. In other words, with the exhaust valve 9 of the rough exhaust line 11 closed, reactive gas is introduced from the reactive gas supply line 4, and, the gate valve 14 of the main exhaust line 8 is opened, the turbo pump 15 is driven, and by adjusting the speed of exhaustion by means of the throttle valve 13 and by way of exhaustion via the main exhaust line 8, the above-mentioned pressure value is maintained. At this time, the rotation speed of the turbo pump 15 is 30000 rpm. Under these conditions, electrical power is applied to the reactive gas inside the reaction chamber 1 by a high-frequency power source (not shown in the figure) to produce high-density plasma, whereby a CVD film is formed on a semiconductor substrate 2. The path, along which reactive gas flows, runs in the following order; from the reaction chamber 1, the throttle valve 13, the gate valve 14, the turbo pump 15, the exhaust valve 6, and to the dry pump 7.

Thereafter, at #401b, similarly to #400, while 1100 sccm of $NF_3$ gas is being introduced from the cleaning gas supply line 5, the pressure in the reaction chamber 1 is controlled to be 3 Torr by way of exhaustion to the rough exhaust line 11, and cleaning is thus performed inside the reaction chamber 1. The path, along which $NF_3$ flows, runs in the following order; from the applicator 12 to the reaction chamber 1, the exhaust valve 9, the throttle valve 10 and the dry pump 7.

Further, steps #401a and #401b constitute one cycle for one semiconductor substrate 2, therefore, by the repetition of 50 cycles, from #402a, #402b . . . to #450a, #450b, a CVD film is formed on fifty semiconductor substrates 2.

However, a problem exists with the conventional CVD film formation method mentioned above in that, irrespective of whether cleaning of the reaction chamber 1 is performed using high-pressure $NF_3$ each time the formation of a film on one semiconductor substrate 2 is complete, a great many particles are produced that cause unsatisfactory formation of a micropattern on the semiconductor substrate 2, and in that the yield of a semiconductor device is therefore dropped.

SUMMARY OF THE INVENTION

It is an object of the present invention to provide a CVD film formation method, as a means of resolving the above-mentioned problems, that is capable of reducing the production of particles which are the cause of unsatisfactory formation of a micropattern on a semiconductor, without causing a drop in productivity, and that is capable of improving the yield of a semiconductor device.

According to a research by the present inventor, et al., the production of particles is caused by the exhaustion of cleaning gas $NF_3$ via a rough exhaust line. This rough exhaust line is utilized to avoid a rise in temperature of a turbo pump as a result of flowing high-pressure cleaning gas in the main exhaust line that comprises this turbo pump, thereby to avoid deformation or the like of the blades of a turbo pump and occurrence of breakdowns thereof. However, because of this, no cleaning gas is made to flow in the main exhaust line, providing no opportunity to remove, by etching, reactants (mostly $SiO_2$ when the high-density plasma CVD film is an insulating film) which are accumulated within the gate valve and the turbo pump. This causes production of particles of the reactant which are then caused to adhere to the semiconductor substrate during the formation of a film.

For this reason, according to the present invention, in a state in which the cleaning-gas pressure is made low, or the rotation speed of the turbo pump is made low, cleaning gas is made to flow in the exhaust line that comprises the turbo pump such that the reactant adhered to this exhaust line may be removed.

In other words, the present invention is characterized in that upon forming a CVD film on a plurality of semiconductor substrates by using a CVD device that comprises a reaction chamber for forming a CVD film, a first exhaust line which is connected to the reaction chamber and does not include a turbo pump, and a second exhaust line which is connected to the reaction chamber separately from the first exhaust line and which includes a turbo pump, two processes are performed, namely, a first process, which is repeated a number of times that corresponds to a predetermined number of substrates, and which comprises: a step of introducing a semiconductor substrate into the above-mentioned reaction chamber to form a CVD film thereon and, removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step of performing low-pressure cleaning of the reaction chamber, from which the above-mentioned semiconductor substrate has been removed, by, while supplying cleaning gas to the reaction chamber, discharging same via the second exhaust line such that the chamber is held at a predetermined low internal pressure that is higher than the pressure during the film formation, and a second process in which high-pressure cleaning of the inside of the reaction chamber is performed by, while supplying cleaning gas to the reaction chamber, discharging the gas via the first exhaust line such that the chamber is held at a predetermined high internal pressure that is higher than the pressure during the above-mentioned film formation. The second process for the high-pressure cleaning using the first exhaust line is implemented at least before or after the first process.

Further, the CVD film formation method according to the present invention is characterized in that upon forming a CVD film on a plurality of semiconductor substrates by using a CVD device that comprises a reaction chamber for forming a CVD film, a first exhaust line which is connected to the above-mentioned reaction chamber and does not include a turbo pump, and a second exhaust line which is connected to the reaction chamber separately from the first exhaust line and which includes a turbo pump, two processes are performed, namely, a first process, which is repeated a number of times that corresponds to a predetermined number of substrates, and which comprises: a step of introducing a semiconductor substrate into the reaction chamber to form a CVD film thereon, and removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step of performing high-pressure cleaning of the reaction chamber, from which the semiconductor substrate has been removed, by, while supplying cleaning gas to the reaction chamber, discharging the gas via the second exhaust line by driving the turbo pump at a rotation speed that is lower than the rotation speed during the film formation such that the chamber is held at a predetermined high internal pressure that is higher than the pressure during the above-mentioned film formation; and a second process in which high-pressure cleaning of the inside of the reaction chamber is performed by, while supplying cleaning gas to the reaction chamber, discharging the gas via the first exhaust line such that the chamber is held at a high internal pressure that is equal to the pressure of the first process. The second process for the high-pressure cleaning using the first exhaust line is implemented at least before or after the first process.

The CVD film formation method according to the present invention is further characterized in that upon forming a CVD film on a plurality of semiconductor substrates by using a CVD device that comprises a reaction chamber for forming a CVD film, a first exhaust line which is connected to the reaction chamber and does not include a turbo pump, and a second exhaust line which is connected to the reaction chamber separately from the first exhaust line and which includes a turbo pump, two processes are performed, namely, a first process which is repeated a number of times that corresponds to a predetermined number of substrates, and which comprises: a step of introducing a semiconductor substrate into the reaction chamber to form a CVD film thereon and, removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step in which high-pressure cleaning of the inside of the reaction chamber, from which the semiconductor substrate has been removed, is performed by, while supplying cleaning gas to the reaction chamber, discharging the gas via the first exhaust line such that the chamber is held at a predetermined high internal pressure that is higher than the pressure during the film formation; and a second process in which low-pressure cleaning of the inside of the reaction chamber is performed by, while supplying cleaning gas to the reaction chamber, discharging the gas via the second exhaust line such that the chamber is held at a predetermined low internal pressure that is lower than the pressure during the high-pressure cleaning. The second process for the low-pressure cleaning using the second exhaust line is implemented at least before or after the first process.

The pressure during the high-pressure cleaning is preferably greater than 1.5 Torr.

The pressure during the low-pressure cleaning is preferably no less than 0.5 Torr and no more than 1.5 Torr.

The rotation speed of the turbo pump during the high-pressure cleaning is preferably no less than 10000 rpm and no more than 20000 rpm.

The cleaning gas employed during the high-pressure cleaning may be nitrogen trifluoride gas, for example.

The cleaning gas employed during the low-pressure cleaning may be nitrogen trifluoride gas and an inert gas, for example.

The inert gas used may be argon, for example.

PREFERRED EMBODIMENTS

A CVD film formation method of the present invention will be explained in concrete terms hereinbelow on the basis of the drawings.

Figure 4:
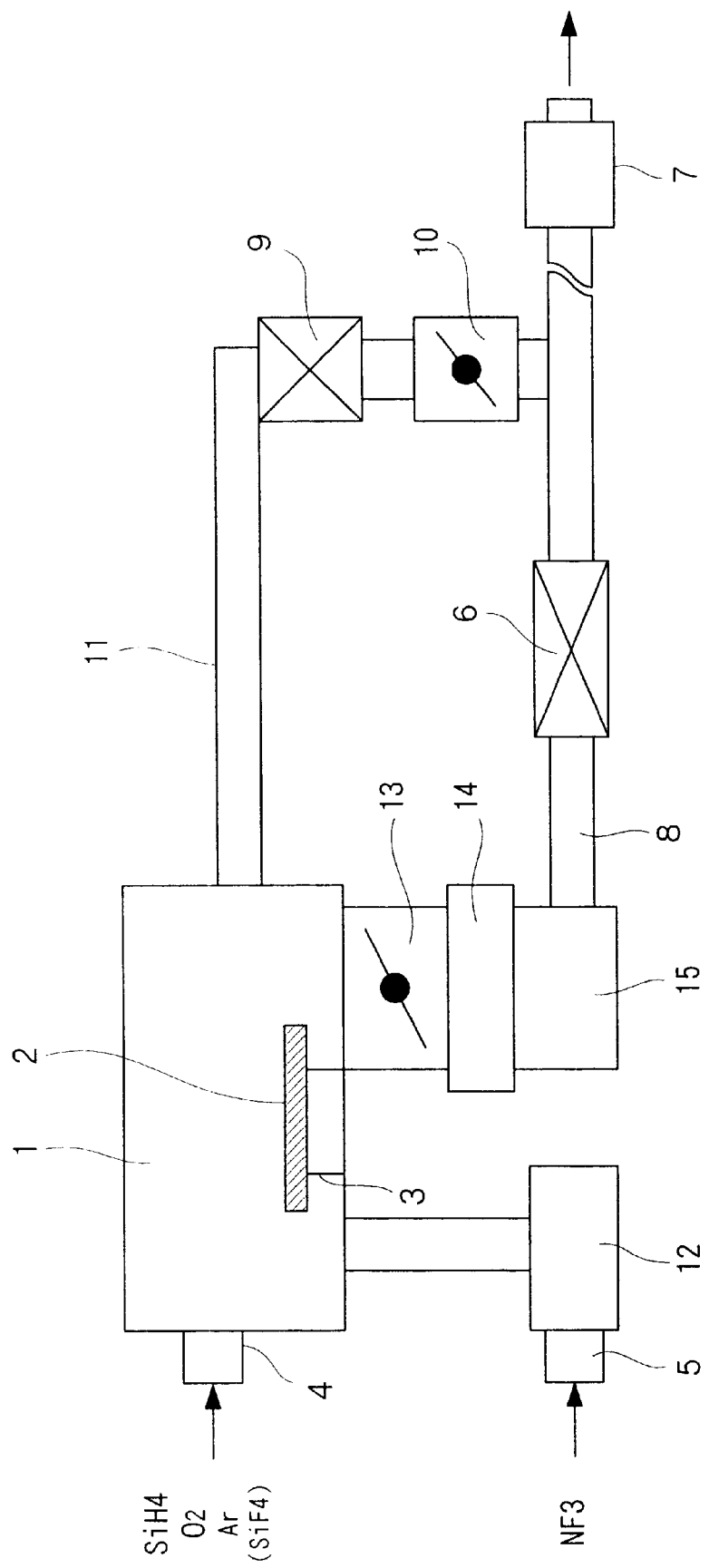
FIG. 4 is a schematic view of the constitution of a conventional high-density plasma CVD device.
Figure 5:
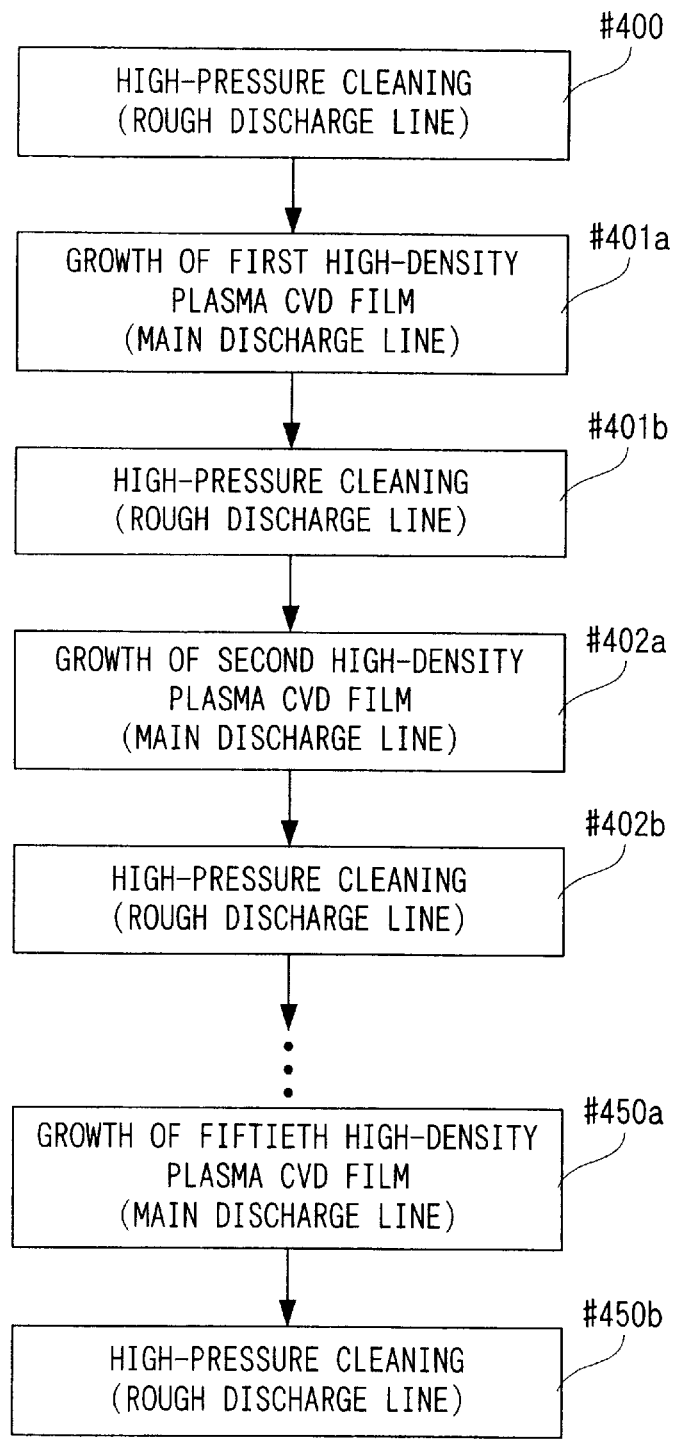
FIG. 5 is a process flow chart showing a conventional CVD film formation process.

In each of the examples hereinbelow, a conventional high-density plasma CVD device is used which is illustrated in FIG. 4, and reference will also be made to this figure in the course of the description of these examples.

EXAMPLE 1

Figure 1:
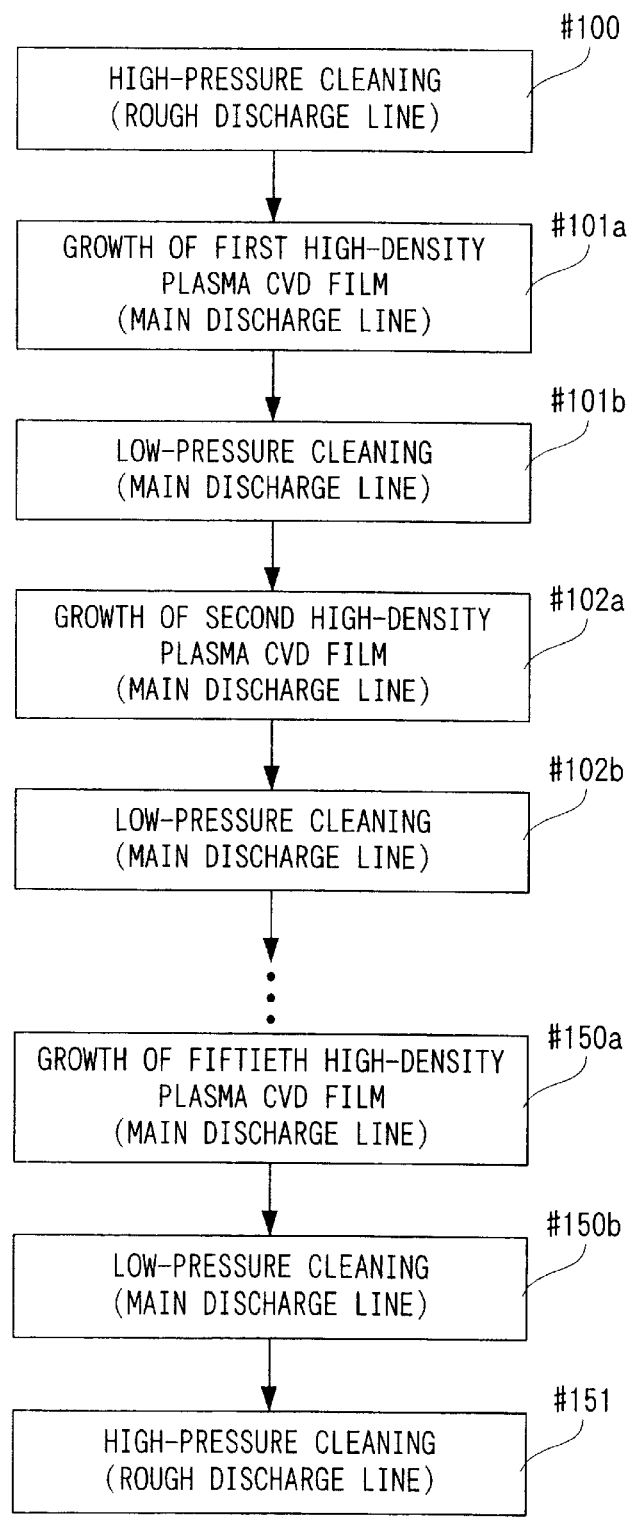
FIG. 1 is a process flow chart showing a CVD film formation process according to a first embodiment of the present invention.

As shown by the flow chart of FIG. 1, first of all, at #100, while 1100 sccm of nitrogen trifluoride ($NF_3$) is being introduced from a cleaning gas supply line 5, the pressure in a reaction chamber 1 is controlled to be a high pressure of 3 Torr by way of exhaust via a rough exhaust line 11 which is at a low vacuum and is connected to a dry pump 7, so that high-pressure cleaning is performed inside the reaction chamber 1. The path, along which $NF_3$ flows, runs in the following order; from an applicator 12, the reaction chamber 1, a exhaust valve 9, a throttle valve 10, and to the dry pump 7.

Next, at #101a, reactive gas, which is a mixture of monosilane ($SiH_4$), oxygen ($O_2$) and argon (Ar), is introduced from a reactive gas supply line 4, and the pressure of the reaction chamber 1 is controlled so as to be 6 m Torr. In other words, with the exhaust valve 9 of the rough exhaust line 11 closed, reactive gas is introduced from the reactive gas supply line 4, and, a gate valve 14 of a main exhaust line 8 is opened, a turbo pump 15 is driven, and, by adjusting the speed of exhaust by means of a throttle valve 13 and by way of exhaust via the main exhaust line 8, the above-mentioned pressure value is maintained. At this time, the rotation speed of the turbo pump 15 is 30000 rpm. Under these conditions, electrical power is applied to the reactive gas inside the reaction chamber 1 by a high-frequency power source (not shown in the figure) to produce high-density plasma, whereby a CVD film is formed on a semiconductor substrate 2. The path, along which reactive gas flows, runs in the following order; from the reaction chamber 1, the throttle valve 13, the gate valve 14, the turbo pump 15, a exhaust valve 6, and to the dry pump 7.

Thereafter, at #101b, while 1100 sccm of NF3 gas from the cleaning gas supply line 5 and 500 sccm of Ar is being introduced, the pressure in the reaction chamber 1 is controlled to be a low pressure of 1 Torr by way of exhaust to the main exhaust line 8, and low-pressure cleaning is thus performed inside the reaction chamber 1 and the main exhaust line 8. At this time, the rotation speed of the turbo pump 15 is 30000 rpm. The path, along which $NF_3$ flows, runs in the following order; from the applicator 12 to the reaction chamber 1, the throttle valve 13, the gate valve 14, the turbo pump 15, the exhaust valve 6 and the dry pump 7.

Further, the above-mentioned steps #101a and #101b constitute one cycle for one semiconductor substrate 2, therefore, by the repetition of 50 cycles, from #102a, #102b . . . to #150a, #150b, a CVD film is formed on fifty semiconductor substrates 2.

Finally, at #151, similarly to #100, while 1100 sccm of $NF_3$ gas is being introduced from the cleaning gas supply line 5, the pressure in the reaction chamber 1 is controlled so as to be 3 Torr by way of exhaust via the rough exhaust line 11, so that high-pressure cleaning is performed inside the reaction chamber 1. The path, along which $NF_3$ flows, runs in the following order; from the applicator 12 to the reaction chamber 1, the exhaust valve 9, the throttle valve 10 and the dry pump 7.

This being so, by virtue of the fact that each time a CVD film is formed, the cleaning (#101b, #102b, . . . ) inside the reaction chamber 1 is implemented via. the main exhaust line 8, reactant that has accumulated in the vicinity of the gate valve 14 or the turbo pump 15 can also be removed by etching, and the production of particles can be suppressed.

At this time, by controlling the $NF_3$ pressure inside the reaction chamber 1 to be a low pressure of 1 Torr, a rise in the temperature of the turbo pump 15 can be prevented. When the relationship was investigated between the pressure of the reaction chamber 1 and the temperature and lifespan of the turbo pump 15, it was established that at a low pressure of no more than 1.5 Torr, the turbo pump 15 could be kept at a temperature of no more than 110 degrees Celsius within a range of an actual rotation speed of the turbo pump 15, and there appeared no effect on the pump lifespan. However, at a pressure of no more than 0.5 Torr, the cleaning rate dropped sharply and a drop in productivity resulted. For this reason, this low-pressure cleaning is implemented within a range of no less than 0.5 Torr and no more than 1.5 Torr. Desirable cleaning conditions are such that the turbo pump 15 has a rotation speed of 30000 rpm and the pressure inside the reaction chamber 1 is from 0.7 to 1.0 Torr.

Further, grounds for employing not only $NF_3$ but also Ar at this time are as follows:

In both high-density plasma CVD film growth step (#101a, . . . ) and low-pressure cleaning step (#101b, . . . ), pressure-control is performed by the same throttle valve 13. For this reason, whereas pressure control in the course of the high-density plasma CVD film growth process is performed at 6 m Torr with the extent of opening of the throttle valve 13 at around 90%, the pressure control in the course of the low-pressure cleaning process is performed at 1 Torr with the throttle valve 13 being almost completely closed with the extent of opening thereof on the order of 10%.

However, particularly in the latter case, pressure control capacity is adversely affected to be on the order of 1.0+/−0.6 Torr so that the above-mentioned 1.5 Torr is sometimes exceeded, which means that the problems remain of a rise in temperature of the turbo pump 15 and a change in the lifespan thereof. However, currently, a throttle valve does not exist that is capable of controlling pressure in a stable manner within a range extending between the above-mentioned ultra-low pressure of 6 m Torr and the low pressure of 1.5 Torr.

Therefore, a method was considered of increasing the opening extent of the throttle valve 13 and of improving pressure control by increasing the $NF_3$ flow amount from 1100 sccm to 1500 sccm. However, on account of the large rise in pressure of $NF_3$ following the conversion thereof into plasma, control of the throttle valve 13 did not satisfy requirements and the amount of variation in pressure was the same as the case where the flow amount was 1100 sccm. This was considered to be due to the fact that $NF_3$ decomposes into $NF_2$ and F as a result of the conversion thereof into plasma and a rise in pressure is generated that corresponds to the rate of this decomposition.

There, a further method was considered in which Ar was added, which, even in the conversion into plasma, does not decompose. Consequently, it was noted that through the addition of Ar in an amount 500 sccm, the pressure could be controlled at 1.0+/−0.2 Torr. This was considered to be attributable to the fact that, through the addition of Ar, it was possible to increase the opening extent of the throttle valve 13 to around 25%, and also that Ar barely fluctuates in pressure, even when converted into plasma. Through the use of Ar, which is an inert gas, no drop in the cleaning rate was observed, which had been a matter of concern. Similar results may be obtained also by using, in place of Ar, other inert gases, such as helium (He), whose volume does not change even when converted into plasma.

In addition, according to the above-mentioned method of Example 1, since cleaning was implemented at a low pressure each time a CVD film was formed, which had conventionally been implemented at a higher pressure, the cleaning effect was decreased. However, by performing a conventional high-pressure cleaning using the rough exhaust line 11 for relatively a long time at #151 after the successive film formation on a plurality of semiconductor substrates 2 has been completed, the inside of the reaction chamber 1 could be cleaned to an equal extent to that of the prior art. $NF_3$ pressure during high-pressure cleaning was at least greater than 1.5 Torr, and preferably no less than 2.0 Torr.

Since the high-pressure cleaning at #151 can be implemented in the course of a pressure-release operation to the atmosphere to facilitate the removal of a semiconductor substrate from a CVD film formation apparatus, there is no drop in productivity. Further, the high-pressure cleaning at #151 may be implemented as a continuation of the low-pressure cleaning at #150b to constitute one process together.

EXAMPLE 2

Figure 2:
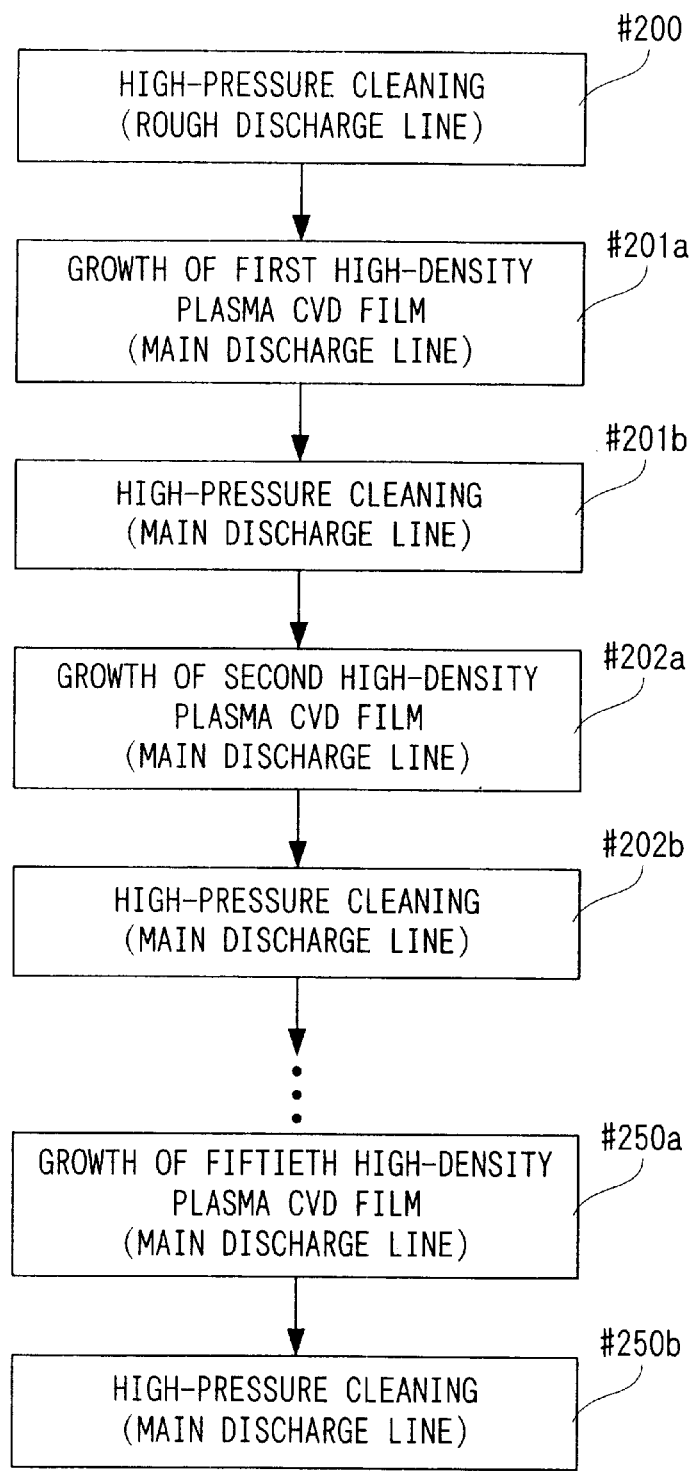
FIG. 2 is a process flow chart showing a CVD film formation process according to a second embodiment of the present invention.

As shown by the flow chart of FIG. 2, at #200, while 1100 sccm of nitrogen trifluoride ($NF_3$) is being introduced from the cleaning gas supply line 5, the pressure in the reaction chamber 1 is controlled to be a high pressure (3 Torr) by way of exhaust via the rough exhaust line 11, which is at a low vacuum and is connected to the dry pump 7, so that high-pressure cleaning is performed inside the reaction chamber 1. The path, along which $NF_3$ flows, runs in the following order; from the applicator 12 to the reaction chamber 1, the exhaust valve 9, the throttle valve 10 and the dry pump 7.

Next, at #201a, reactive gas, which is a mixture of monosilane ($SiH_4$), oxygen ($O_2$) and argon (Ar), is introduced from the reactive gas supply line 4, and the pressure of the reaction chamber 1 is controlled to be 6 m Torr. In other words, reactive gas is introduced from the reactive gas supply line 4, and the gate valve 14 of the main exhaust line 8 is opened, the turbo pump 15 is driven, and by adjusting the speed of exhaust by means of throttle valve 13, exhaust is effected via the main exhaust line 8, so that the above-mentioned pressure value is maintained. At this time, the rotation speed of the turbo pump 15 is 30000 rpm. Under these conditions, electrical power is applied to the reactive gas inside the reaction chamber 1 by a high-frequency power source (not shown in the figure) to produce high-density plasma, whereby a CVD film is formed on a semiconductor substrate 2. The path, along which reactive gas flows, runs in the following order; from the reaction chamber 1, the throttle valve 13, the gate valve 14, the turbo pump 15, the exhaust valve 6, and to the dry pump 7.

Thereafter, at #201b, while 1100 sccm of $NF_3$ gas is being introduced from the cleaning gas supply line 5 by way of exhaust to the main exhaust line 8, the pressure in the reaction chamber 1 is controlled to be high as 3 Torr, and high-pressure cleaning is thus performed inside the reaction chamber 1 and the main exhaust line 8. At this time, the rotation speed of the turbo pump 15 is low at 15000 rpm. The path, along which $NF_3$ flows, runs in the following order; from the applicator 12 to the reaction chamber 1, the throttle valve 13, the gate valve 14, the turbo pump 15, the exhaust valve 6 and the dry pump 7.

Further, steps #201a and #201b constitute one cycle for one semiconductor substrate 2, therefore, by the repetition of 50 cycles, from #202a, #202b . . . to #250a, #250b, a CVD film is formed on fifty semiconductor substrates 2.

This being so, by virtue of the fact that cleaning (#201b, #202b, . . . ) inside the reaction chamber 1 is implemented, via the main exhaust line 8, each time a CVD film is formed, reactant that has accumulated in the vicinity of the gate valve 14 or the turbo pump 15 can also be removed by etching, and the production of particles can be suppressed.

At this time, by causing the turbo pump 15 to rotate at a rotation speed that is lower than the rotation speed during the CVD film formation, a rise in the temperature of the turbo pump 15 can be prevented along with breakdowns caused by this rise in temperature. When the relationship was investigated between the pressure of the reaction chamber 1 and the temperature and lifespan of the turbo pump 15, it was established that, within a high-pressure region of 3 Torr, by causing the turbo pump 15 to rotate at a low speed of no more than 15000 rpm, the turbo pump 15 could be set at a temperature of no more than 110 degrees Celsius, and there was no effect on the pump lifespan. However, when the rotation speed was below 10000 rpm, a stable rotation speed could not be secured, resulting in unstable pressure. For this reason, the rotation of the turbo pump is effected within a range of no less than 10000 rpm and no more than 20000 rpm.

Since the $NF_3$ pressure is no different from that of the high-pressure cleaning of the prior art, such cleaning effects can be secured that are equal to those of the prior art, and in this point, Example 2 is superior to Example 1 in the cleaning of the main exhaust line 8.

EXAMPLE 3

Figure 3:
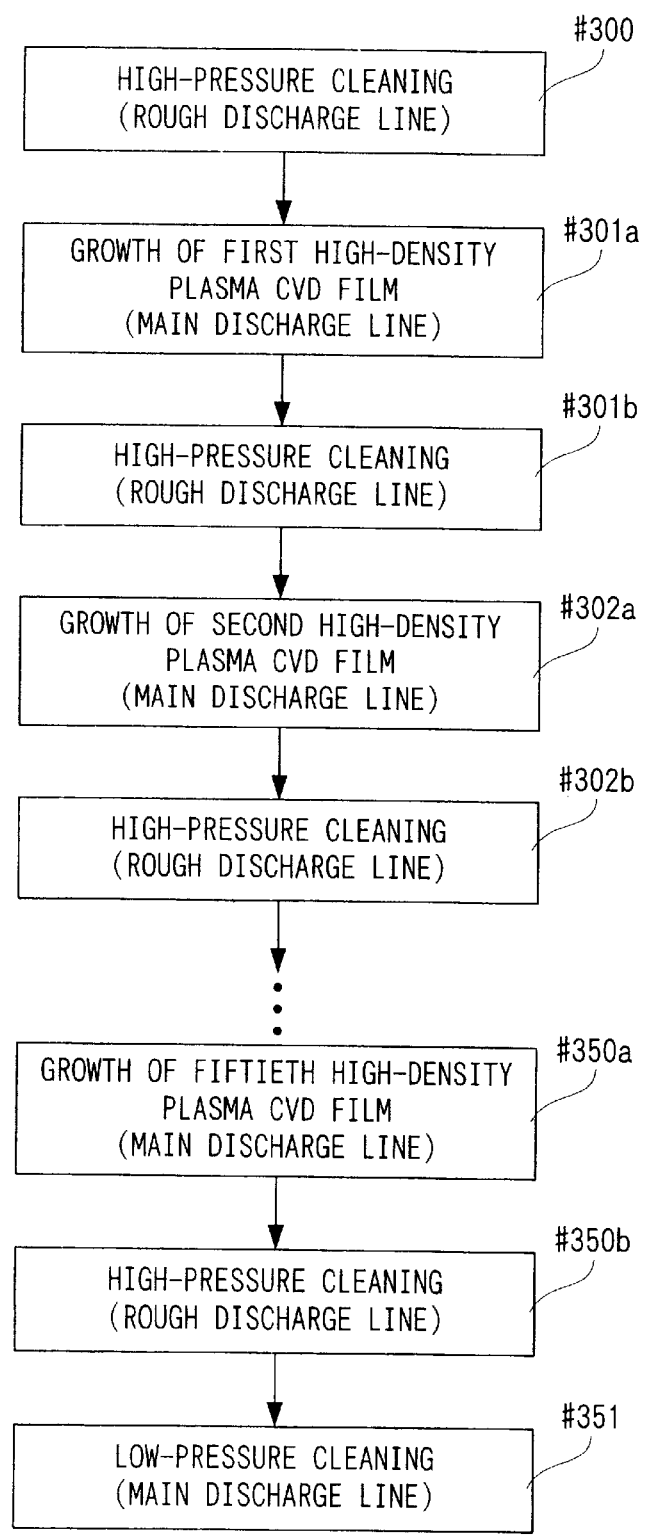
FIG. 3 is a process flow chart showing a CVD film formation process according to a third embodiment of the present invention.

As shown by the flow chart in FIG. 3, at #300, while 1100 sccm of nitrogen trifluoride ($NF_3$) is being introduced from cleaning gas supply line 5, the pressure in the reaction chamber 1 is controlled to be a high pressure of 3 Torr by way of exhaust via the rough exhaust line 11, which is at a low vacuum and is connected to the dry pump 7, so that high-pressure cleaning is performed inside the reaction chamber 1. The path, along which $NF_3$ flows, runs in the following order; from the applicator 12 to the reaction chamber 1, the exhaust valve 9, the throttle valve 10 and the dry pump 7.

Next, at #301a, reactive gas, which is a mixture of monosilane ($SiH_4$), oxygen ($O_2$) and argon (Ar), is introduced from the reactive gas supply line 4, and the pressure of the reaction chamber 1 is controlled to be 6 m Torr. In other words, the reactive gas is introduced from the reactive gas supply line 4, and the gate valve 14 of the main exhaust line 8 is opened, the turbo pump 15 is driven, and by adjusting the speed of exhaust by means of throttle valve 13, exhaust is effected via the main exhaust line 8, so that the above-mentioned pressure value is maintained. At this time, the rotation speed of the turbo pump 15 is 30000 rpm. Under these conditions, electrical power is applied to the reactive gas inside the reaction chamber 1 by a high-frequency power source (not shown in the figure) to produce high-density plasma, whereby a CVD film is formed on a semiconductor substrate 2. The path, along which reactive gas flows, runs in the following order; from the reaction chamber 1, the throttle valve 13, the gate valve 14, the turbo pump 15, the exhaust valve 6, and to the dry pump 7.

Thereafter, at #301*b*, similarly to #300, while 1100 sccm of NF$_3$ gas is being introduced from the cleaning gas supply line 5, the pressure in the reaction chamber 1 is controlled to be 3 Torr by way of exhaust to the rough exhaust line 11, and high-pressure cleaning is thus performed inside the reaction chamber 1. The path, along which NF$_3$ flows, runs in the following order; from the applicator 12 to the reaction chamber 1, the exhaust valve 9, the throttle valve 10 and the dry pump 7.

Further, steps #301*a* and #301*b* constitute one cycle for one semiconductor substrate 2, therefore, by the repetition of 50 cycles, from #302*a*, #302*b* . . . to #350*a*, #350*b*, a CVD film is formed on fifty semiconductor substrates 2.

Finally, at #351, while 1100 sccm of NF3 gas and 500 sccm of Ar are being introduced from the cleaning gas supply line 5, the pressure in the reaction chamber 1 is controlled to be a low pressure of 1 Torr by way of exhaust to the main exhaust line 8, and low-pressure cleaning is thus performed inside the reaction chamber 1 and the main exhaust line 8. At this time, the rotation speed of the turbo pump 15 is 30000 rpm. The path, along which NF$_3$ flows, runs in the following order; from the applicator 12 to the reaction chamber 1, the throttle valve 13, the gate valve 14, the turbo pump 15, the exhaust valve 6 and the dry pump 7. Here, the grounds for employing not only NF$_3$ but also Ar at this time are the same as those in Example 1.

This being so, while ensuring the cleaning implemented inside the reaction chamber 1 each time a CVD film is formed to make similar cleaning effects to those of the prior-art high-pressure cleaning implemented using the rough exhaust line 11, low-pressure cleaning is implemented at 1 Torr via the main exhaust line 8 after the formation of a film on a plurality of semiconductor substrates 2 is completed, so that the reactant that has accumulated in the vicinity of the gate valve 14 or the turbo pump 15 can also be removed by etching, and the production of particles can be suppressed.

Since the final low-pressure cleaning can be implemented in the course of a pressure-release operation to the atmosphere to facilitate the removal of a semiconductor substrate from a CVD film formation apparatus, there is no drop in productivity.

Furthermore, although the low-pressure cleaning of the main exhaust line 8 is implemented after the successive formation of a film on a plurality of semiconductor substrates 2 is completed, similar results may also be obtained by implementing the cleaning before the start of this successive film formation (in the course of vacuum removal to facilitate the installation of a semiconductor substrate in an apparatus for film formation). However, since the cleaning is implemented only before the start of successive film formation or after the completion thereof, the results of cleaning the main exhaust line 8 are inferior to the results obtained in Example 1 or Example 2, according to which cleaning of the main exhaust line 8 is performed each time the film formation on one semiconductor substrate 2 is completed.

In addition, in the above-mentioned Examples 1 to 3, high-density plasma CVD film formation has been exemplified in which reactive gas is employed that does not contain fluorine (F). However, also when a high-density plasma CVD film is formed by employing a reactive gas containing fluorine or the like, similar cleaning results and particle-prevention results may be obtained.

The main-exhaust line cleaning process may also be one in which the conditions of Examples 1 to 3 are combined, such as a process involving the combination of a low rotation speed for the turbo pump (no more than 25000 rpm), and low-pressure NF$_3$ gas (a pressure of no more than 1.5 Torr).

As described hereinabove, by means of the CVD film formation method of the present invention, by causing exhaust of cleaning gas, which is for cleaning the inside of the reaction chamber, via the exhaust line on which the turbo pump is placed, and, by making the cleaning gas pressure or the turbo pump rotation speed lower than those of the prior art, it was also possible to perform cleaning of the above-mentioned exhaust line without causing the turbo pump to break down or causing a drop in productivity. As a result, reactant that had accumulated in the vicinity of the turbo pump or the gate valve could be removed by etching, and the production of particles could be suppressed, whereby an improvement was realized in the yield of a semiconductor device.

What is claimed is:

1. A CVD film formation method for forming a CVD film on a plurality of semiconductor substrates by using a CVD device that comprises a reaction chamber for forming a CVD film, a first exhaust line which is connected to the reaction chamber and does not include a turbo pump, and a second exhaust line which is connected to the reaction chamber separately from the first exhaust line and which includes a turbo pump, the method comprising:

a first process, which is repeated a number of times that corresponds to a predetermined number of substrates, and which comprises: a step of introducing a semiconductor substrate into the reaction chamber to form a CVD film thereon, and removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step of performing low-pressure cleaning of the reaction chamber, from which the semiconductor substrate has been removed, by, while supplying cleaning gas to the reaction chamber, discharging the gas via the second exhaust line such that the chamber is held at a predetermined low internal pressure that is higher than the pressure during the film formation; and a second process in which high-pressure cleaning of the inside of the reaction chamber is performed by, while supplying cleaning gas to the reaction chamber, discharging the gas via the first exhaust line such that the chamber is held at a predetermined high internal pressure that is higher than the pressure during the film formation.

2. A CVD film formation method for forming a CVD film on a plurality of semiconductor substrates by using a CVD device that comprises a reaction chamber for forming a CVD film, a first exhaust line which is connected to the reaction chamber and does not include a turbo pump, and a second exhaust line which is connected to the reaction chamber separately from the first exhaust line and which includes a turbo pump, the method comprising:

a first process, which is repeated a number of times that corresponds to a predetermined number of substrates, and which comprises: a step of introducing a semiconductor substrate into the reaction chamber to form a CVD film thereon, and removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step of performing high-pressure cleaning of the reaction chamber, from which the semiconductor substrate has been removed, by, while supplying cleaning gas to the reaction chamber, discharging the gas via the second exhaust line by driving the turbo pump at a rotation speed that is lower than the rotation speed during the film formation such that the chamber is held at a predetermined high internal pressure that is higher than the pressure during the film formation; and a second process in which high-pressure cleaning of the inside of the reaction chamber is performed by, while supplying cleaning gas to the reaction chamber, discharging the gas via the first exhaust line such that the chamber is held at a high internal pressure that is equal to the pressure of the first process.

3. A CVD film formation method for forming a CVD film on a plurality of semiconductor substrates by using a CVD device that comprises a reaction chamber for forming a CVD film, a first exhaust line which is connected to the reaction chamber and does not include a turbo pump, and a second exhaust line which is connected to the reaction chamber separately from the first exhaust line and which includes a turbo pump, the method comprising:

a first process, which is repeated a number of times that corresponds to a predetermined number of substrates, and which comprises: a step of introducing a semiconductor substrate into the reaction chamber to form a CVD film thereon, and removing the semiconductor substrate, whose film formation is completed, from the chamber, in a state in which, while reactive gas is being supplied to the reaction chamber, the turbo pump is driven to exhaust the reactive gas via the second exhaust line such that the chamber is held at a predetermined internal reaction pressure; and a step of performing high-pressure cleaning of the reaction chamber, from which the semiconductor substrate has been removed, by, while supplying cleaning gas to the reaction chamber, discharging the gas via the first exhaust line such that the chamber is held at a predetermined high internal pressure that is higher than the pressure during the film formation; and a second process in which low-pressure cleaning of the inside of the reaction chamber is performed by, while supplying cleaning gas to the reaction chamber, discharging the gas via the second exhaust line such that the chamber is held at a predetermined low internal pressure that is lower than the pressure during the high-pressure cleaning.

4. The CVD film formation method according to claim 1, wherein the pressure during the high-pressure cleaning is greater than 1.5 Torr.

5. The CVD film formation method according to claim 1, wherein the pressure during the low-pressure cleaning is no less than 0.5 Torr and no more than 1.5 Torr.

6. The CVD film formation method according to claim 2, wherein the rotation speed of the turbo pump during the high-pressure cleaning is no less than 10000 rpm and no more than 20000 rpm.

7. The CVD film formation method according to claim 1, wherein the cleaning gas employed during the high-pressure cleaning is nitrogen trifluoride gas.

8. The CVD film formation method according to claim 1, wherein the cleaning gas employed during the low-pressure cleaning is nitrogen trifluoride gas and an inert gas.

9. The CVD film formation method according to claim 8, wherein the inert gas is argon.

\* \* \* \* \*